(12) United States Patent
Yen et al.

(10) Patent No.: US 7,651,351 B2
(45) Date of Patent: Jan. 26, 2010

(54) CARD CONNECTOR WITH A CARD INSERTION GUIDE

(75) Inventors: Ming-Hui Yen, Taipei-Hsien (TW); Yeh-Hsi Lin, Taipei Hsien (TW)

(73) Assignee: Chant Sincere Co., Ltd, Taipei Hsien (TW)

( * ) Notice: Subject to any disclaimer, the term of this patent is extended or adjusted under 35 U.S.C. 154(b) by 51 days.

(21) Appl. No.: 12/099,164

(22) Filed: Apr. 8, 2008

(65) Prior Publication Data
US 2009/0156049 A1 Jun. 18, 2009

(30) Foreign Application Priority Data
Dec. 12, 2007 (TW) .............................. 96221123 U (51) Int. Cl.
*H01R 13/62* (2006.01)
(52) U.S. Cl. ...................... 439/159; 439/328
(58) Field of Classification Search .................. 439/159, 439/155, 630, 328, 327
See application file for complete search history.

(56) References Cited

U.S. PATENT DOCUMENTS

| 6,976,860 | B1* | 12/2005 | Su .............................. 439/159 |
| 7,361,035 | B1* | 4/2008 | Lai ............................. 439/155 |
| 7,367,824 | B1* | 5/2008 | Yen et al. ..................... 439/152 |
| 7,427,206 | B2* | 9/2008 | Takei et al. .................. 439/159 |
| 2008/0081497 | A1* | 4/2008 | Lai ............................. 439/155 |

* cited by examiner

*Primary Examiner*—Neil Abrams
*Assistant Examiner*—Phuong Nguyen (57) ABSTRACT

A card connector includes an electrically insulative frame base, which defines a card insertion space and a sliding slot at one side of the card insertion space, a metal shielding cover, which covers the card insertion space and has an elongated guide hole corresponding to the sliding slot, a slide slidably mounted in the sliding slot, an elastic member connected between the slide and the rear side of the electrically insulative frame base, a guide rod fastened to the rear side of the electrically insulative frame base to guide movement of the slide along the sliding slot, and a limiter member fastened to the slide and movable along the elongated guide hole of the metal shielding cover for guiding an electronic card into the card insertion space and holding the inserted electronic card in positive contact with respective metal terminals in the electrically insulative frame base.

6 Claims, 8 Drawing Sheets

CARD CONNECTOR WITH A CARD INSERTION GUIDE

This application claims the priority benefit of Taiwan patent application number 096221123 filed on Dec. 12, 2007.

BACKGROUND OF THE INVENTION

1. Field of the Invention

The present invention relates to card connectors and more specifically, to a card connector, which has a card insertion guide for guiding an electronic card in and out of the card insertion space smoothly and preventing sudden jumping of the inserted electronic card out of the card connector upon ejection of the inserted electronic card.

2. Description of the Related Art

Following rapid development of modern technology, electronic products, such as computer, cellular phone, PDA (Personal Digital Assistant), digital camera, digital video camera, digital sound recorder and etc. are modularized to provide multiple functions. Further, an electronic product may be provided with a card connector for the insertion of an electronic card (memory card) for storing data. Commercially available memory cards include MMC (MultiMedia Card), SD (SecureDigital Memory Card), SM (Smart Media Card), CF (CompactFlash Card), SMC (SmartMedia Card), MS (Memory Stick) and etc. Following the market trend toward light, thin, short and small characteristics, advanced memory cards and card connectors are made relatively smaller. To facilitate insertion and ejection of a memory card, a card connector usually provides a card ejector, i.e., PUSH-PUSH function (two push actions complete one cycle). When ejecting the inserted memory card, the card ejector is forced by a spring member to push the inserted memory card out of the card connector. However, if the user presses the card ejector suddenly with an excessively high pressure, the spring force may force the inserted memory card to jump out of the card connector, causing damage.

Figure 8:
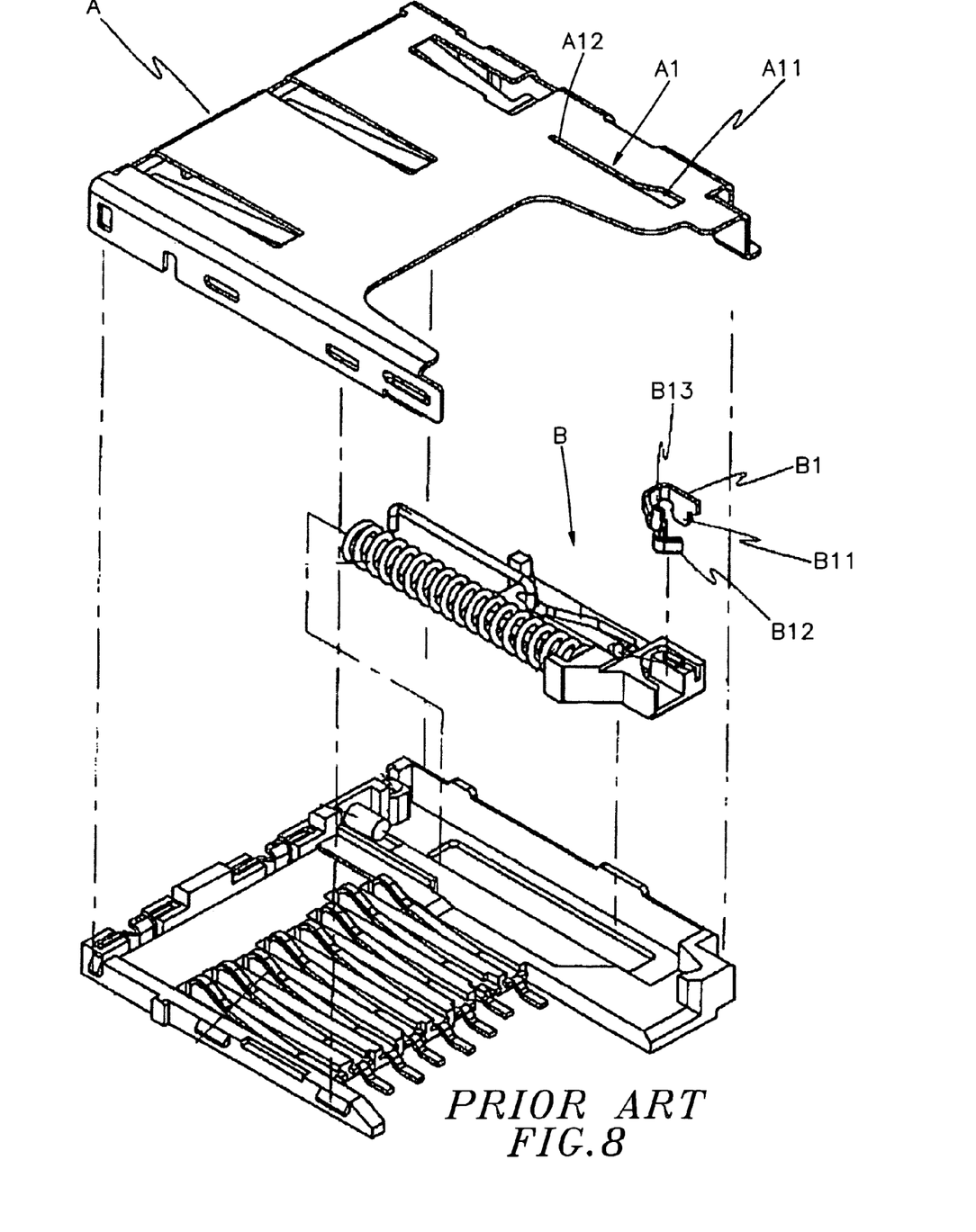
FIG. 8 is an exploded view of a card connector according to the prior art.

FIG. 8 illustrates a card connector according to the prior art. According to this design, a metal shielding cover A of the card connector has a guide slot A1 for guiding movement of a card retaining member B1 of a card ejector B. The guide slot A1 has a narrow elongated guide portion A12, and a wide front portion A11 at the front side of the narrow elongated guide portion A12. The card retaining member B1 has a mounting portion B11 at one end, a spring arm B12 at the other end, and a guide portion B13 upwardly extending from the top side and inserted into the guide slot A1 to guide movement of the card retaining member B1 along the guide slot A1. During card ejection, the guide portion B13 is moved along the narrow elongated guide portion A12 into the wide front portion A11, and the spring arm B12 is kept in engagement with the memory card before the guide portion B13 reaches the wide front portion A11. When the guide portion B13 reached the wide front portion A11, the spring arm B12 is released from the memory card.

The aforesaid prior art card connector is still not satisfactory in function because of the following drawbacks:

1. During movement of the memory card into or out of the card connector, the narrow elongated guide portion A12 does not allow the card retaining member B1 to displace subject to the curving of the sliding track of the card ejector B, and a stress is concentrated at the guide portion B13 of the card retaining member B1. This concentration of stress may cause the guide portion B13 to deform permanently or to break.

2. The guide portion B13 is suspending in the wide front portion A11 without any support before movement of the card ejector B by a memory card. When a memory card is inserted into the card connector to move the card retaining member B1, the guide portion B13 may displace in the wide front portion A11, causing vibration or unstable positioning of the memory card.

Therefore, it is desirable to provide a card connector that eliminates the aforesaid drawbacks.

SUMMARY OF THE INVENTION

The present invention has been accomplished under the circumstances in view. It is therefore the main object of the present invention to provide a card connector, which has a card insertion guide to guide an electronic card in and out of the card insertion space smoothly. It is another object of the present invention to provide a card connector, which prevents sudden jumping of the inserted electronic card when the user ejects the inserted electronic card.

To achieve this and other objects of the present invention, the card connector comprises an electrically insulative frame base, which comprises a card insertion space that accommodates a set of metal terminals and a sliding slot disposed at one side relative to the card insertion space, a metal shielding cover, which covers the card insertion space and comprises an elongated guide hole corresponding to the sliding slot of the electrically insulative frame base, and a card insertion guide adapted to guide insertion of an electronic card into the card insertion space and into contact with the metal terminals in the card insertion space electrically. The elongated guide hole of the metal shielding cover comprises a narrow elongated front section, a narrow elongated rear section, and a wide middle section connected between the narrow elongated front section and the narrow elongated rear section. The narrow elongated front section and the narrow elongated rear section have a respective width gradually reducing in direction away from the wide middle section. The card insertion guide comprises a slide slidably mounted in the sliding slot and a limiter member fastened to the slide. The limiter member comprises an upwardly protruding guide portion inserted into and movable along the elongated guide hole on the metal shielding cover, and a resilient retaining portion extending out of the slide and suspending in the card insertion space for securing the inserted electronic card in position.

DETAILED DESCRIPTION OF THE PREFERRED EMBODIMENT

Figure 1:
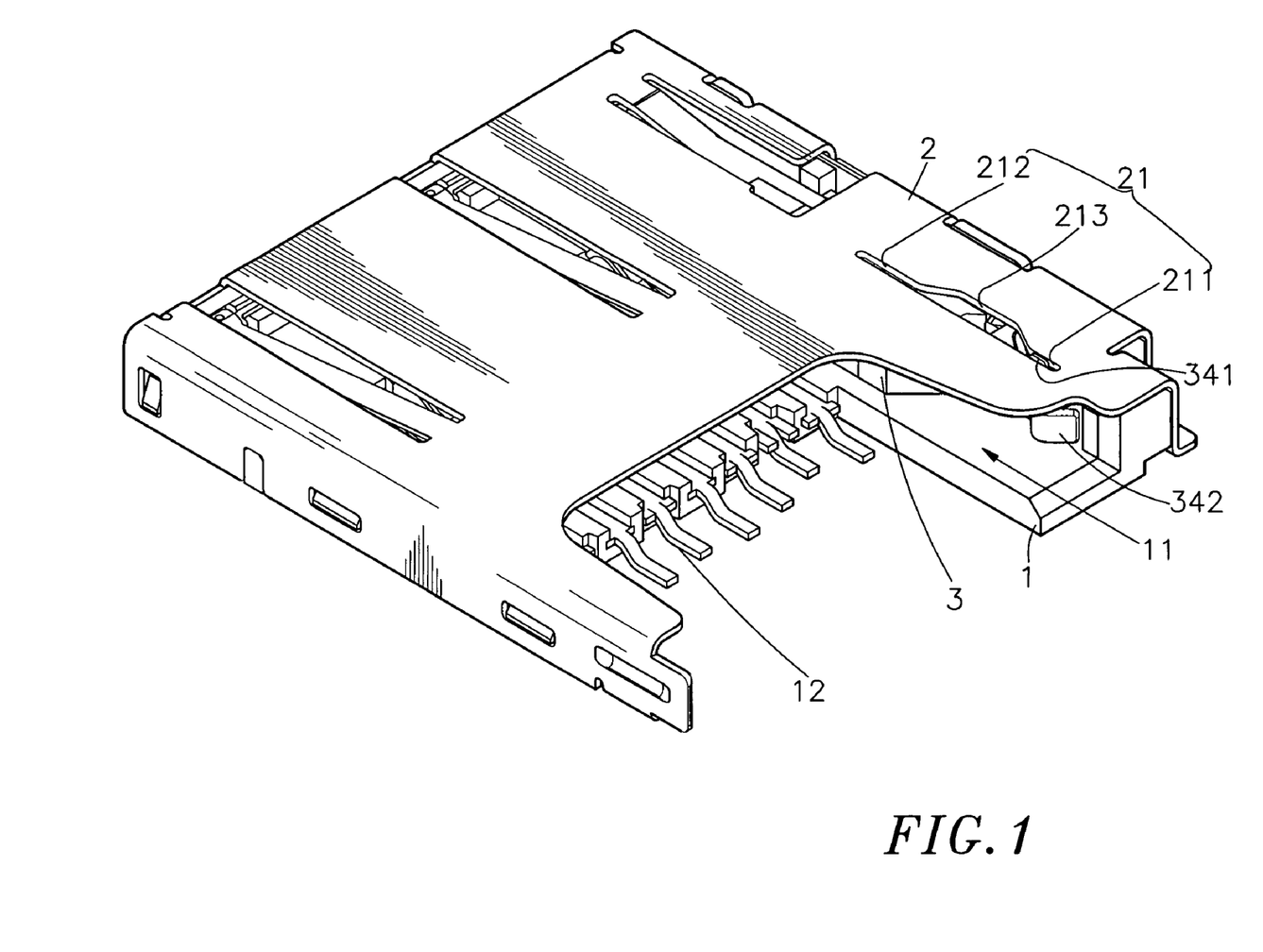
FIG. 1 is an oblique elevation of a card connector in accordance with the present invention.
Figure 2:
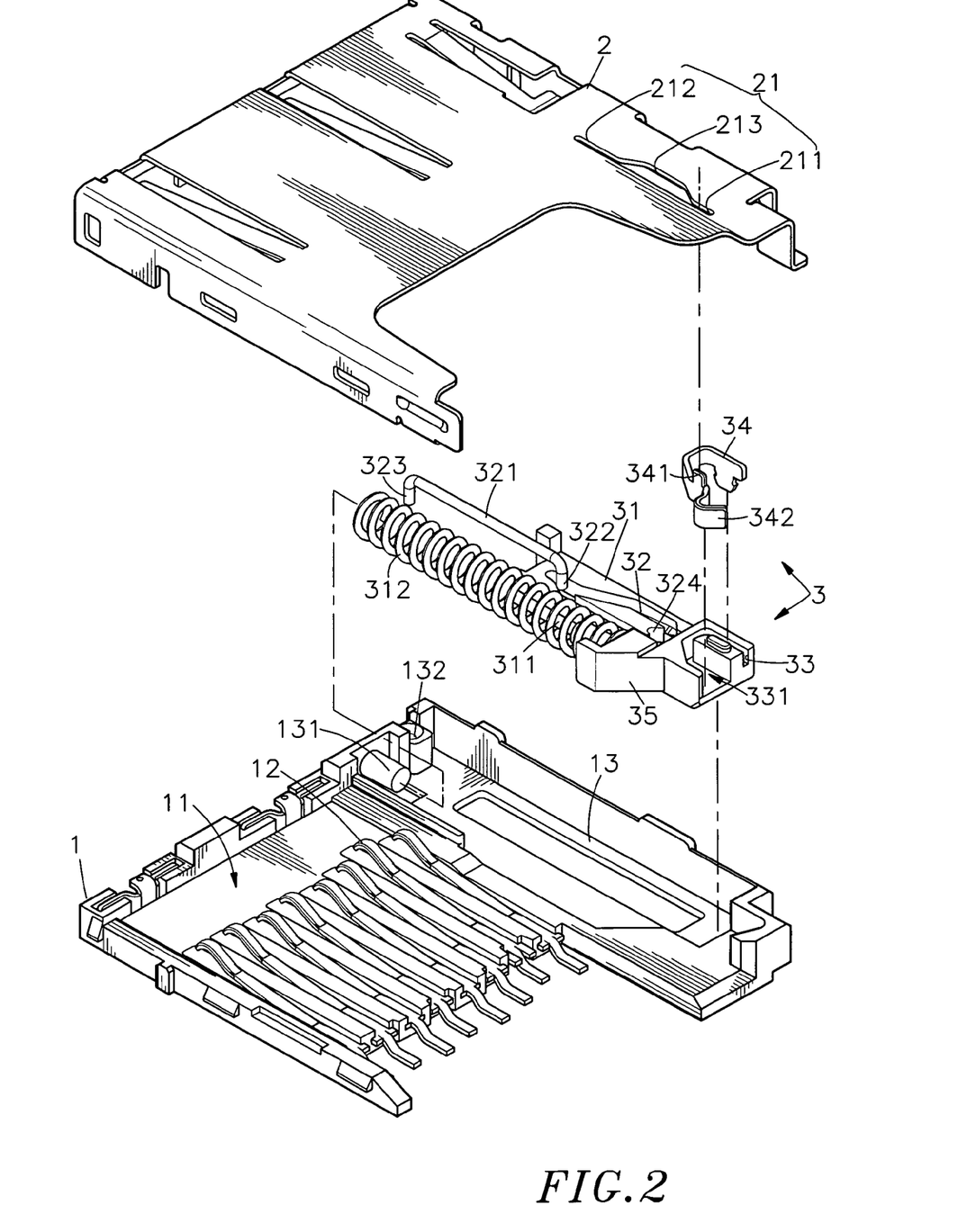
FIG. 2 is an exploded view of the card connector in accordance with the present invention.
Figure 3:
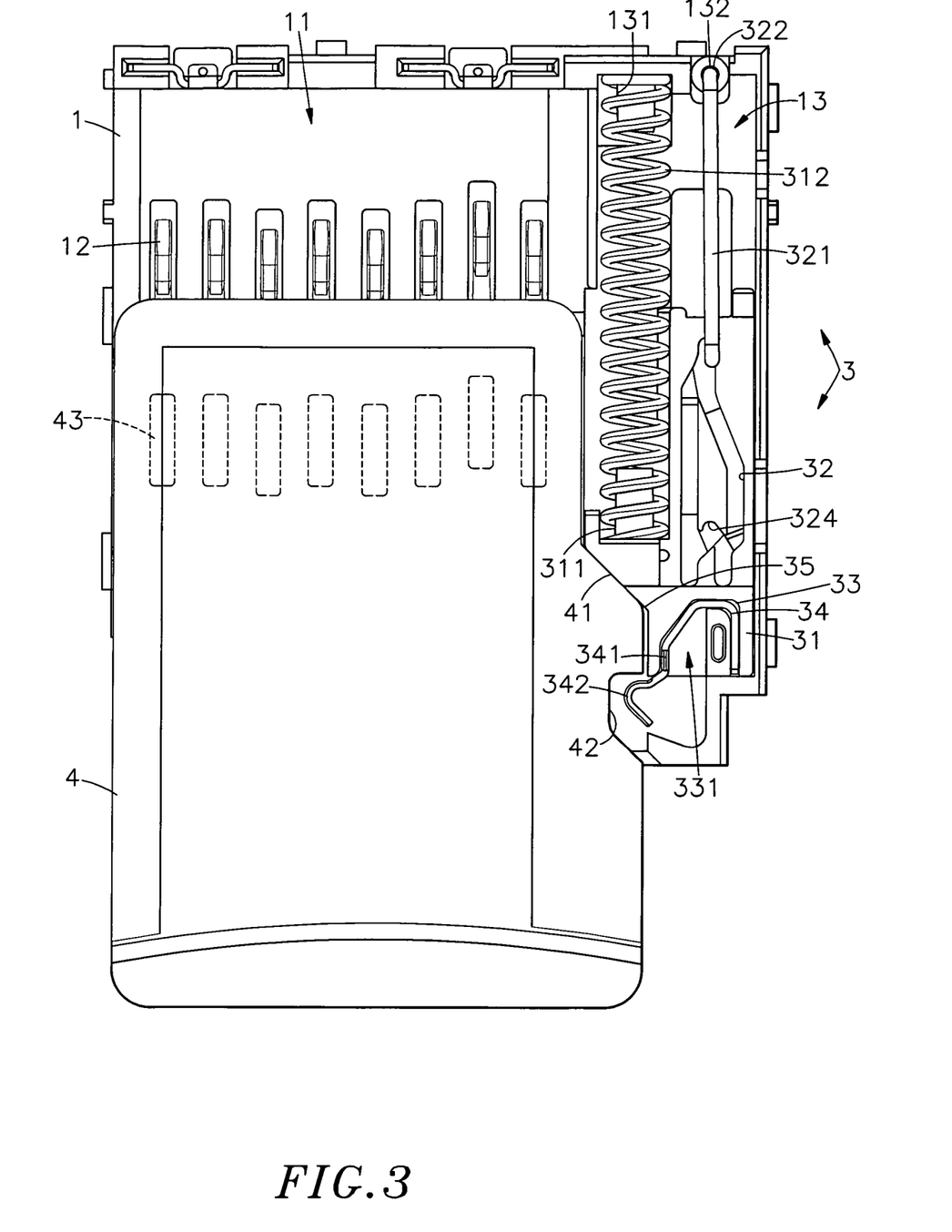
FIG. 3 is a schematic top view of the card connector in accordance with the present invention after removal of the metal shielding cover.

Referring to FIGS. 1~3, a card connector in accordance with the present invention is shown comprising an electrically insulative frame base 1, a metal shielding cover 2 and a card insertion guide 3.

The electrically insulative frame base 1 comprises a card insertion space 11 that accommodates a set of metal terminals 12, a sliding slot 13 disposed at one side relative to the metal terminals 12, a locating rod 131 extending from the rear side wall corresponding to the sliding slot 13, and a locating hole 132 disposed adjacent to the locating rod 131.

The metal shielding cover 2 is a substantially U-shaped cover plate, having an elongated guide hole 21 cut through the top and bottom walls thereof. The elongated guide hole 21 has a narrow elongated front section 211, a narrow elongated rear section 212, and a wide middle section 213 connected between the narrow elongated front section 211 and the narrow elongated rear section 212. The narrow elongated front section 211 and the narrow elongated rear section 212 have a respective width gradually reducing in direction away from the wide middle section 213.

The card insertion guide 3 comprises a slide 31, an axle 311 perpendicularly extending from one side of the slide 31, an elastic member, for example, compression spring 312 coupled between the axle 311 and the locating rod 131, a sliding track 32 defined in the slide 31, a retaining hole 324 defined in the slide 31 and connected to one end of the sliding track 32, a guide rod 321, which has a rear mounting end 323 fastened to the locating hole 132 of the electrically insulative frame base 1 and a front guide end 322 coupled to the sliding track 32 to guide movement of the slide 31 along the sliding slot 13, a substantially U-shaped mounting groove 33 defined in the slide 31 at a front side relative to the sliding track 32, a substantially U-shaped limiter member 34, which is fastened to the U-shaped mounting groove 33 and has an upwardly protruding guide portion 341 inserted into the elongated guide hole 21 of the metal shielding cover 2 and an arched resilient retaining portion 342 extending from one side of the upwardly protruding guide portion 341 to the outside of the U-shaped mounting groove 33 and suspending in one lateral side of the card insertion space 11, and an oblique stop face 35 located on a front lateral side of the slide 31 in front of the axle 311 and at one lateral side relative to the U-shaped mounting groove 33.

During installation, the metal shielding cover 2 is covered on the electrically insulative frame base 1 over the card insertion space 11, and then the slide 31 of the card insertion guide 3 is set in the sliding slot 13 inside the card insertion space 11, and then the compression spring 312 is coupled between the axle 311 and the locating rod 131, and then the rear mounting end 323 of the guide rod 321 is fastened to the locating hole 132 of the electrically insulative frame base 1 and the front guide end 322 of the guide rod 321 is coupled to the sliding track 32, and then the U-shaped limiter member 34 is fastened to the U-shaped mounting groove 33 to have the arched resilient retaining portion 342 of the U-shaped limiter member 34 be suspending in one lateral side of the card insertion space 11 and the upwardly protruding guide portion 341 be inserted into the elongated guide hole 21 of the metal shielding cover 2, and thus the installation of the card connector is done.

Figure 4:
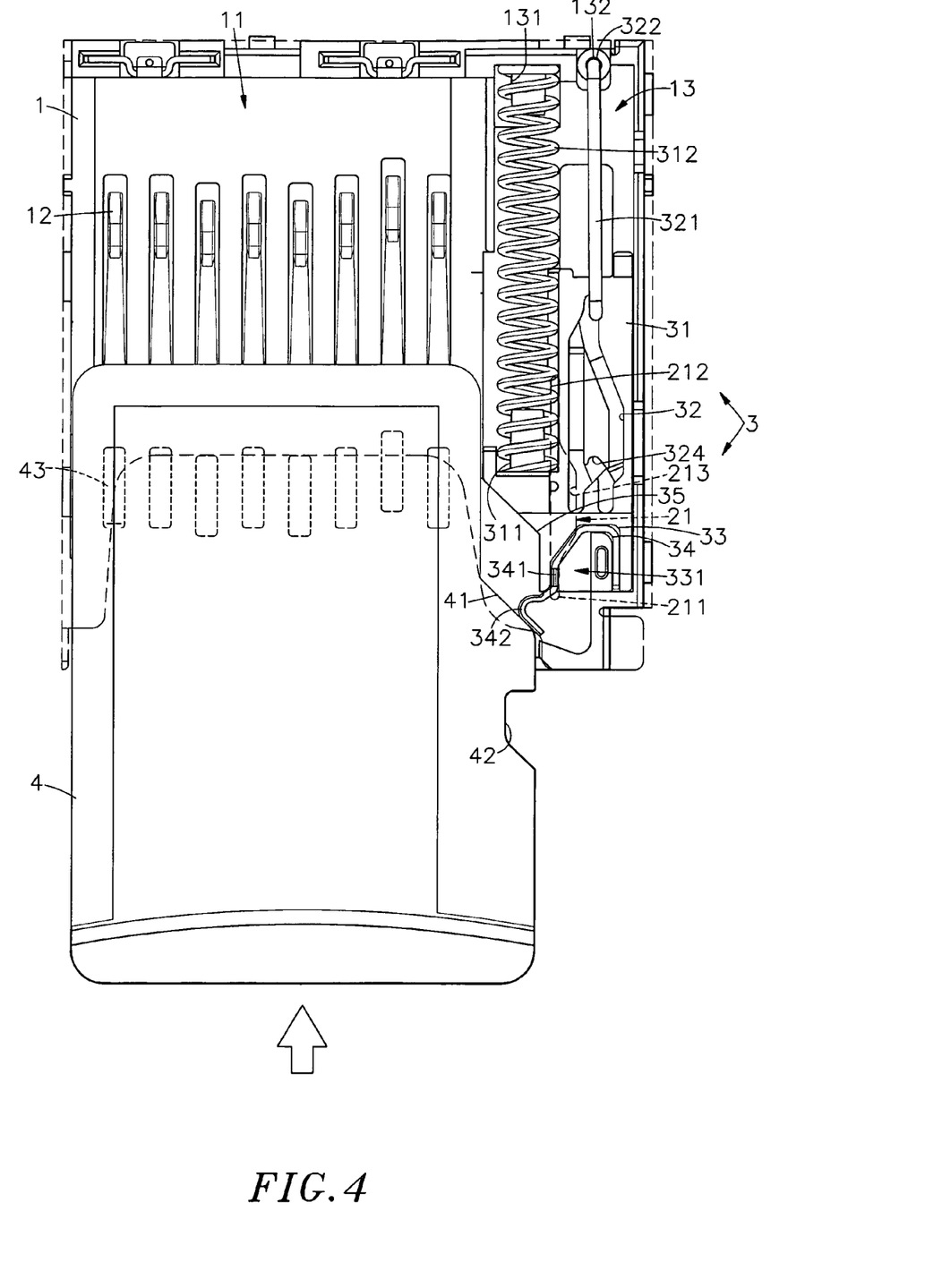
FIG. 4 is a schematic top view of the present invention, showing the insertion of an electronic card (I).
Figure 5:
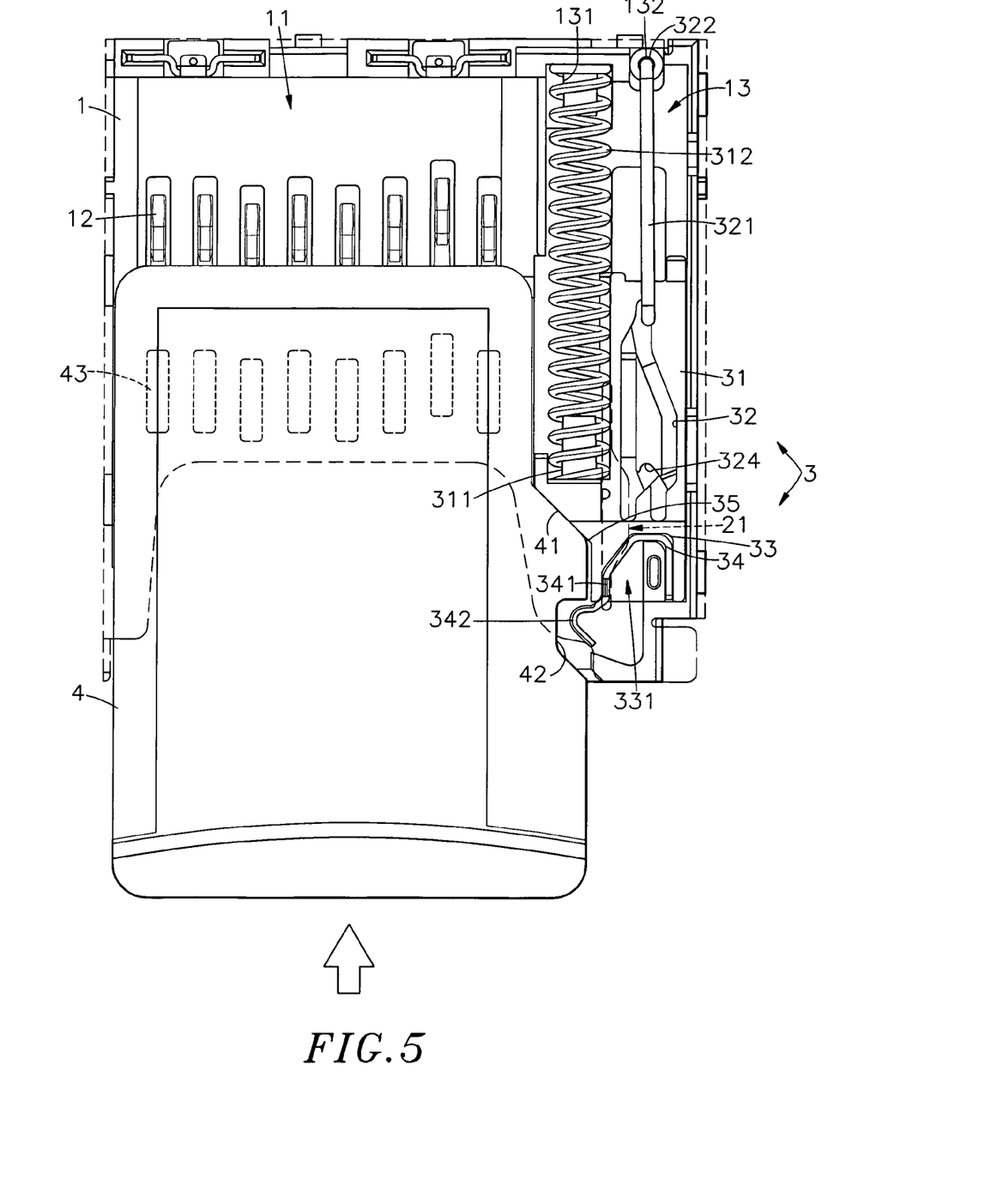
FIG. 5 is a schematic top view of the present invention, showing the insertion of an electronic card (II).
Figure 6:
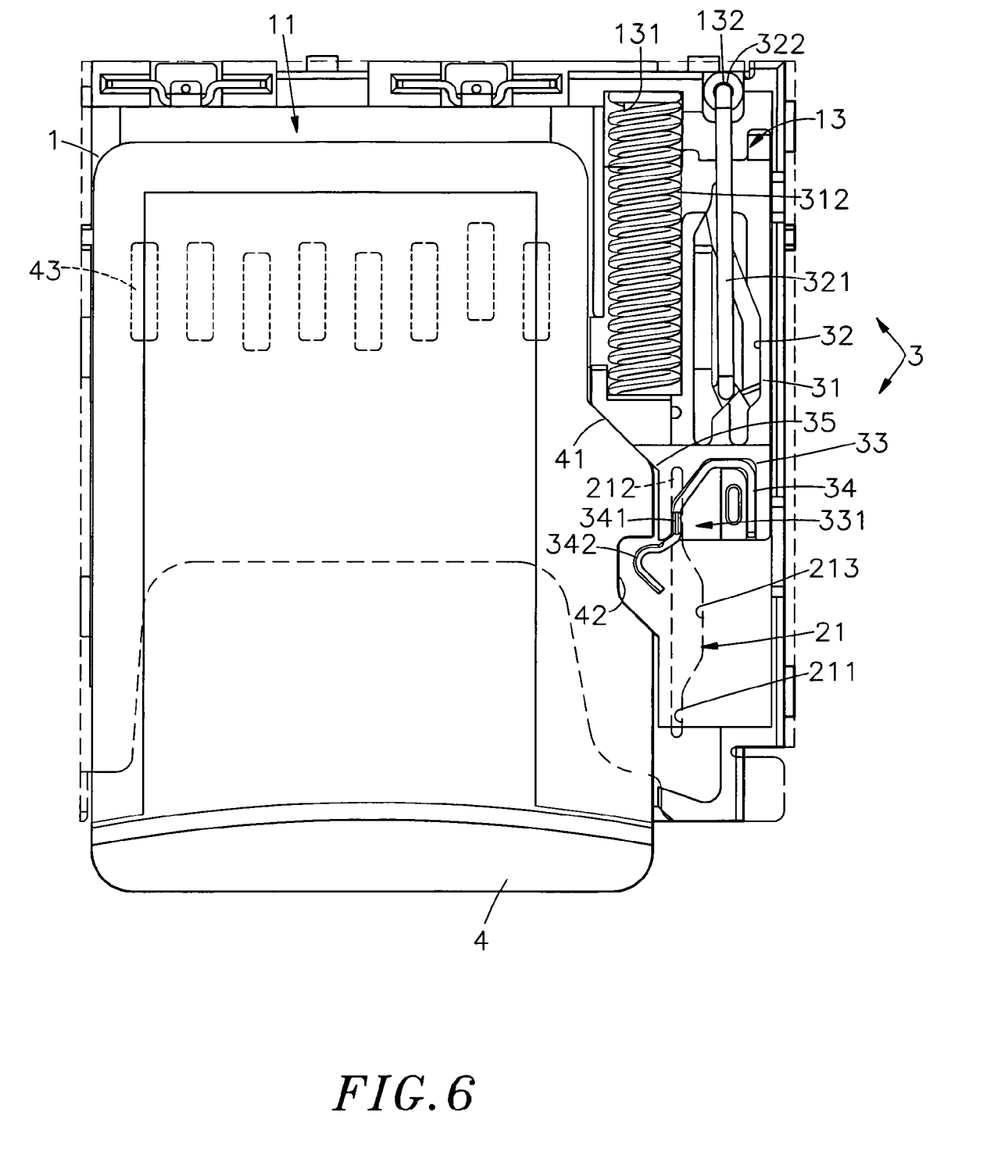
FIG. 6 is a schematic top view of the present invention, showing the insertion of an electronic card (III).

Referring to FIGS. 4~6 and FIG. 2 again, when in use, an electronic card 4 is inserted into the card insertion space 11 of the electrically insulative frame base 1. During insertion of the electronic card 4, an oblique stop face 41 of the electronic card 4 is forced against the arched resilient retaining portion 342 of the U-shaped limiter member 34, thereby moving the U-shaped limiter member 34 along the elongated guide hole 21 on the metal shielding cover 2 and the slide 31 along the sliding slot 13. During backward movement of the U-shaped limiter member 34, the upwardly protruding guide portion 341 is shifted from the narrow elongated front section 211 into the wide middle section 213. When the upwardly protruding guide portion 341 reached the wide middle section 213, the pressure from the oblique stop face 41 of the electronic card 4 forces the arched resilient retaining portion 342 to curve sideways, allowing the oblique stop face 41 of the electronic card 4 to pass over the arched resilient retaining portion 342 and then stopped against the oblique stop face 35 of the card insertion guide 3. When the oblique stop face 41 of the electronic card 4 passed over the arched resilient retaining portion 342, the material spring power of the U-shaped limiter member 34 immediately returns the arched resilient retaining portion 342 into shape, forcing the arched resilient retaining portion 342 into engagement with a retaining notch 42 of the electronic card 4. When continuously inserting the electronic card 4 toward the inside of the card insertion space 11 of the electrically insulative frame base 1, the slide 31 and the U-shaped limiter member 34 of the card insertion guide 3 are moved with the electronic card 4 to the position where the upwardly protruding guide portion 341 is forced into the narrow elongated rear section 212 of the elongated guide hole 21 of the metal shielding cover 2, the compression spring 312 is compressed, and the retaining hole 324 is forced into engagement with the front guide end 322 of the guide rod 321. At this time, the electronic card 4 is held in position inside the card insertion space 11, keeping metal contacts 43 of the electronic card 4 in positive contact with the metal terminals 12 respectively. Therefore, the electronic card 4 is kept electrically connected to the card connector.

When wishing to reject the electronic card 4 out of the card insertion space 11 of the electrically insulative frame base 1, push the electronic card 4 toward the inside of the card insertion space 11 to move the slide 31 and to further disengage the retaining hole 324 from the front guide end 322 of the guide rod 321. At this time, the compression spring 312 releases the preserved spring power to push the slide 31 toward the outside of the card insertion space 11, and therefore the electronic card 4 is moved with the slide 31 toward the outside of the card insertion space 11. At this time, the upwardly protruding guide portion 341 of the U-shaped limiter member 34 is forced into the narrow elongated front section 211 of the elongated guide hole 21, the arched resilient retaining portion 342 is kept in engagement with the retaining notch 42 of the electronic card 4 to prevent sudden jumping of the electronic card 4 out of the card connector, and the electronic card 4 has a part suspending inside the card insertion space 11 and a part suspending outside the electrically insulative frame base 1. Thus, the user can pull the electronic card 4 out of the electrically insulative frame base 1 directly with the fingers.

The aforesaid U-shaped limiter member 34 is a single piece member directly stamped from a metal plate into shape. Therefore, the U-shaped limiter member 34 is durable in use, and can be moved positively with the slide 31 to shift the upwardly protruding guide portion 341 along the narrow elongated front section 211, the wide middle section 213 and the narrow elongated rear section 212 of the elongated guide hole 21 subject to the movement of the sliding track 32 with the slide 31 relative to the front guide end 322 of the guide rod 321, guiding the electronic card 4 in and out of the electrically insulative frame base 1 positively.

The aforesaid electronic card 4 can be a Mini Card, CF (CompactFlash Card), PCMCIA card, MMC (MultiMedia Card), SMC (SmartMedia Card), MS (Memory Stick) or SD (SecureDigital Memory Card). The electrically insulative frame base 1, the metal shielding cover 2 and the card insertion guide 3 are configured to fit the electronic card 4.

Figure 7:
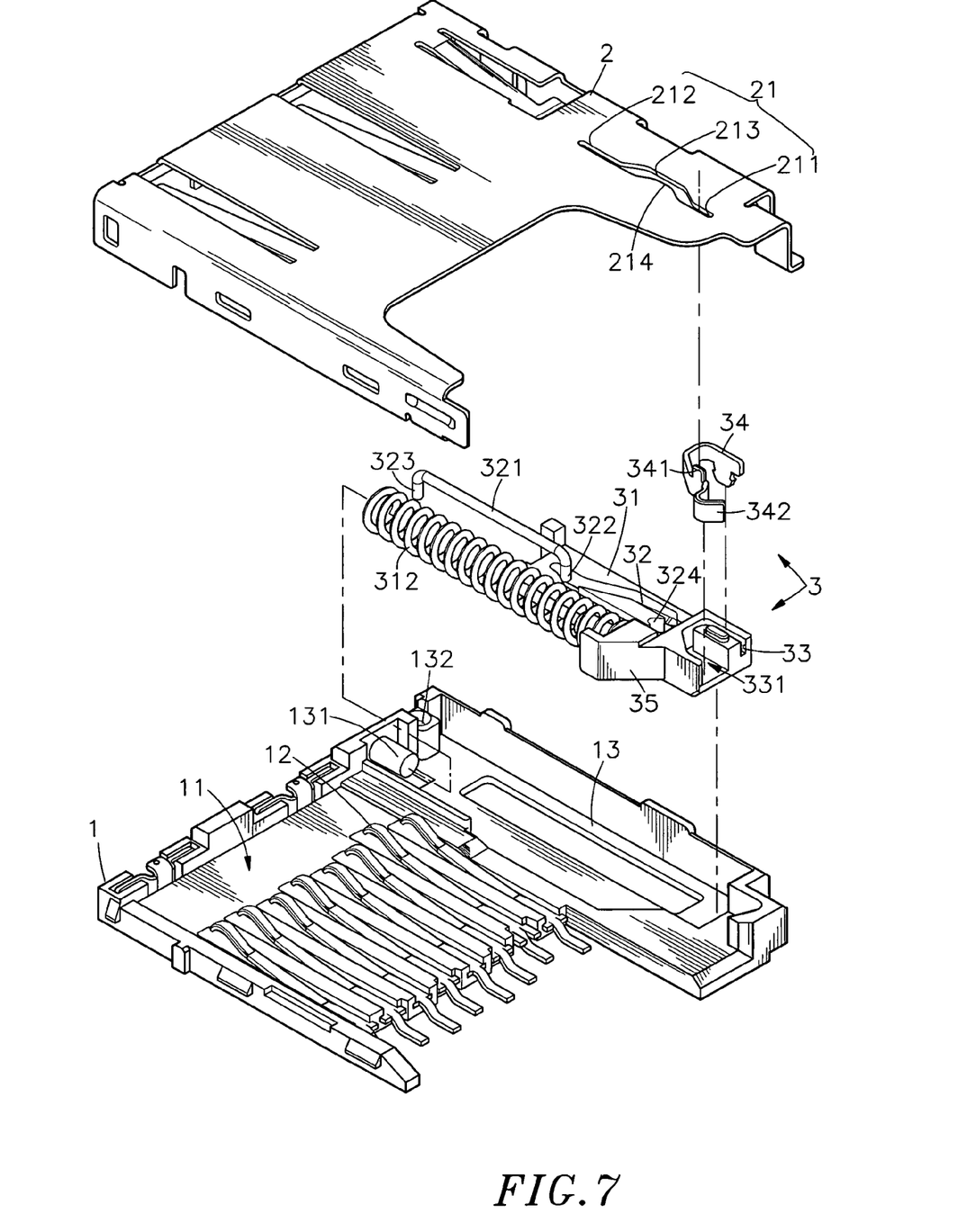
FIG. 7 is an exploded view of an alternate form of the card connector in accordance with the present invention.

FIG. 7 is an exploded view of an alternate form of the card connector. This alternate form is substantially similar to the aforesaid first embodiment with the exception that the metal shielding cover 2 has a stop flange 214 disposed at one side of the wide middle section 213 of the elongated guide hole 21. This embodiment is to fit a relatively bigger size of electronic card 4. When an electronic card 4 is inserted into the card insertion space 11 of the electrically insulative frame base 1, the upwardly protruding guide portion 341 is moved with the U-shaped limiter member 34 along the elongated guide hole 21, and the arched resilient retaining portion 342 of the U-shaped limiter member 34 extends to the outside of the U-shaped mounting groove 33, and a wide space 331 at one end of the U-shaped mounting groove 33 allows displacement of the arched resilient retaining portion 342, and therefore the arched resilient retaining portion 342 is kept away from the electronic card 4 for smooth insertion of the electronic card 4 during displacement of the upwardly protruding guide portion 341 between the wide middle section 213 of the elongated guide hole 21 and the stop flange 214, preventing deformation or breaking of the upwardly protruding guide portion 341 due to an external pressure.

As stated above, the U-shaped limiter member 34 is fastened to the U-shaped mounting groove 33 at the slide 31 and moved with the slide 31 along the narrow elongated front section 111, the wide middle section 213 and the narrow elongated rear section 212 of the elongated guide hole 21 on the metal shielding cover 2 subject to the movement of the sliding track 32 with the slide 31 relative to the front guide end 322 of the guide rod 321, guiding the electronic card 4 in and out of the electrically insulative frame base 1 positively. When the user ejected the inserted electronic card 4, the arched resilient retaining portion 342 of the U-shaped limiter member 34 will be forced into engagement with the retaining notch 42 of the electronic card 4, preventing sudden jumping of the electronic card 4 out of the card connector. Further, the sliding track 32, the elongated guide hole 21 and the U-shaped limiter member 34 are configured to assure positive insertion and ejection of the electronic card.

In general, the invention provides a card connector that has the following advantages and features:

1. The U-shaped limiter member 34 is fastened to the U-shaped mounting groove 33 at the slide 31 and moved with the slide 31 along the narrow elongated front section 211, the wide middle section 213 and the narrow elongated rear section 212 of the elongated guide hole 21 on the metal shielding cover 2 subject to the movement of the sliding track 32 with the slide 31 relative to the front guide end 322 of the guide rod 321, guiding the electronic card 4 in and out of the electrically insulative frame base 1 positively.

2. Before insertion of the electronic card 4 into the card insertion space 11 of the electrically insulative frame base 1, the upwardly protruding guide portion 341 is held in the narrow elongated front section 211 of the elongated guide hole 21 on the metal shielding cover 2, therefore when the user inserts the electronic card 4 into the card insertion space 11, the user can sense two-step positioning of the electronic card 4 by touch, and therefore the electronic card 4 can be positively inserted into position without deviation.

3. During PUSH-PUSH action of the slide 31, the sliding track 32 is moved with the slide 31 relative to the front guide end 322 of the guide rod 321, and the upwardly protruding guide portion 341 of the U-shaped limiter member 34 is moved along the elongated guide hole 21 on the metal shielding cover 2, preventing permanent deformation or breaking of the U-shaped limiter member 34.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A card connector comprising:
    an electrically insulative frame base, said electrically insulative frame base comprising a card insertion space that accommodates a set of metal terminals, and a sliding slot disposed at one side relative to said card insertion space;
    a metal shielding cover fastened to said electrically insulative frame base to cover said card insertion space, said metal shielding cover comprising an elongated guide hole corresponding to said sliding slot of said electrically insulative frame base, said elongated guide hole comprising a narrow elongated front section, a narrow elongated rear section, and a wide middle section connected between said narrow elongated front section and said narrow elongated rear section, said narrow elongated front section and said narrow elongated rear section having a respective width gradually reducing in direction away from said wide middle section; and
    a card insertion guide adapted to guide insertion of an electronic card into said card insertion space and into contact with said metal terminals in said card insertion space electrically, said card insertion guide comprising a slide slidably mounted in said sliding slot and a limiter member fastened to said slide, said limiter member comprising an upwardly protruding guide portion inserted into and movable along said elongated guide hole on said metal shielding cover and a resilient retaining portion extending out of said slide and suspending in said card insertion space for securing the inserted electronic card in position.

2. The card connector as claimed in claim 1, wherein said metal shielding cover comprises a stop flange disposed at one side of said wide middle section of said elongated guide hole corresponding to said resilient retaining portion of said limiter member.

3. The card connector as claimed in claim 1, wherein said electrically insulative frame base comprises a locating rod perpendicularly extending from a rear side thereof corresponding to said sliding slot, and a locating hole disposed at one side of said locating rod; said card insertion guide further comprises an elastic member connected between said locating rod of said electrically insulative frame base and said slide, and a guide rod fastened to said locating hole of said electrically insulative frame base and adapted to guide movement of said slide along said sliding slot.

4. The card connector as claimed in claim 3, wherein said slide comprises a sliding track; said guide rod has a rear mounting end fastened to said locating hole of said electrically insulative frame base and a front guide end inserted into said sliding track of said slide to guide movement of said slide along said sliding slot of said electrically insulative frame base.

5. The card connector as claimed in claim 1, wherein said slide comprises a U-shaped mounting groove disposed at a front side thereof for the mounting of said limiter member.

6. The card connector as claimed in claim 5, wherein said limiter member is a U-shaped single-piece metal member fastened to said U-shaped mounting groove of said slide.

* * * * *